(12) United States Patent
McConney et al.

(10) Patent No.: US 10,601,400 B1
(45) Date of Patent: Mar. 24, 2020

(54) FREQUENCY TUNABLE RF FILTERS VIA A WIDE-BAND SAW-MULTIFERROIC HYBRID DEVICE

(71) Applicant: Government of the United States as represented by the Secretary of the Air Force, Wright-Patterson AFB, OH (US)

(72) Inventors: Michael E. McConney, Beavercreek, OH (US); Brandon M. Howe, Beavercreek, OH (US); Piyush Shah, West Chester, OH (US); Michael R. Page, Powell, OH (US)

( * ) Notice: Subject to any disclaimer, the term of this patent is extended or adjusted under 35 U.S.C. 154(b) by 86 days.

(21) Appl. No.: 16/102,123

(22) Filed: Aug. 13, 2018

Related U.S. Application Data

(60) Provisional application No. 62/555,407, filed on Sep. 7, 2017.

(51) Int. Cl.
*H03H 9/64* (2006.01)
*H03H 9/22* (2006.01)
(Continued)

(52) U.S. Cl.
CPC .......... *H03H 9/64* (2013.01); *H03H 9/0296* (2013.01); *H03H 9/1457* (2013.01);
(Continued)

(58) Field of Classification Search
CPC .. H03H 2/001; H03H 9/0296; H03H 9/02637; H03H 9/22; H03H 9/14514;
(Continued)

(56) References Cited

U.S. PATENT DOCUMENTS 3,707,689 A * 12/1972 Morgenthaler .......... H03H 9/40
333/147
4,078,186 A    3/1978 Folen et al.
(Continued)

FOREIGN PATENT DOCUMENTS

DE            10208169 A1     9/2003

OTHER PUBLICATIONS

Scheerschmidt, G., et al., "Investigation of Magnetostrictive Microdevices," IEEE Transactions on Magnetics, vol. 43, No. 6, Jun. 2007, pp. 2722-2724.
(Continued)

*Primary Examiner* — Barbara Summons
(74) *Attorney, Agent, or Firm* — AFMCLO/JAZ; Timothy Barlow

(57) ABSTRACT

A filter including a piezoelectric substrate; a surface acoustic wave (SAW) device on the piezoelectric substrate and including unequally spaced interdigitated input and output transducer electrodes of unequal widths, wherein the input transducer electrodes are to convert an incoming radio frequency (RF) electrical signal into surface acoustic waves; a SAW propagation path between the input and output transducer electrodes; and a magnetostrictive film in the SAW propagation path to filter the surface acoustic waves that are at a ferromagnetic resonance frequency of the magnetostrictive film, wherein the output transducer electrodes are to convert the filtered surface acoustic waves into an outgoing electrical RF signal. The SAW device may operate in a wide-band pass configuration. The wide-band pass configuration result in a transmission of frequencies up to −60 dB. The magnetostrictive film may include a ferromagnetic material. The interdigitated input and output transducer electrodes may include unequal widths between adjacent electrodes.

20 Claims, 17 Drawing Sheets

(51) Int. Cl.
*H03H 9/02* (2006.01)
*H03H 9/145* (2006.01)
*H03H 9/42* (2006.01)

(52) U.S. Cl.
CPC .... *H03H 9/14514* (2013.01); *H03H 9/14547* (2013.01); *H03H 9/14555* (2013.01); *H03H 9/22* (2013.01); *H03H 9/426* (2013.01); *H03H 9/643* (2013.01); *H03H 2210/012* (2013.01)

(58) Field of Classification Search
CPC ........... H03H 9/14547; H03H 9/14555; H03H 9/1457; H03H 9/426; H03H 9/64; H03H 9/6423; H03H 9/643; H03H 2210/012
USPC .................................................. 333/201, 193
See application file for complete search history.

(56) References Cited

U.S. PATENT DOCUMENTS

| | | | |
|---|---|---|---|
| 4,199,737 A * | 4/1980 | Patterson | G06G 7/19 310/25 |
| 4,209,759 A | 6/1980 | Volluet | |
| 4,565,984 A | 1/1986 | Castera et al. | |
| 5,260,615 A | 11/1993 | Sahashi et al. | |
| 5,959,388 A | 9/1999 | Graebner et al. | |
| 6,046,657 A | 4/2000 | Alers et al. | |
| 6,242,844 B1 | 6/2001 | Puttagunta et al. | |
| 6,255,916 B1 | 7/2001 | Nakamura et al. | |
| 6,320,479 B1 | 11/2001 | Alers et al. | |
| 6,362,543 B1 | 3/2002 | Ellis | |
| 6,535,545 B1 | 3/2003 | Ben-Bassat et al. | |
| 6,541,893 B2 | 4/2003 | Zhu et al. | |
| 7,348,867 B2 | 3/2008 | Hattori | |
| 7,656,253 B2 | 2/2010 | Stokes et al. | |
| 7,855,564 B2 | 12/2010 | Sabah et al. | |
| 8,269,490 B2 | 9/2012 | Koyilothu et al. | |
| 2005/0174014 A1 | 8/2005 | Korden et al. | |
| 2007/0159270 A1 * | 7/2007 | Sunwoo | H03H 9/0571 333/133 |
| 2007/0183190 A1 | 8/2007 | Eyckmans et al. | |
| 2010/0253326 A1 | 10/2010 | Koyilothu et al. | |

OTHER PUBLICATIONS

Thevenard, L., et al., "Surface-acoustic-wave-driven ferromagnetic resonance in(Ga,Mn)(As,P) epilayers," Physical Review B 90, Sep. 2, 2014, pp. 094401-1 to 094401-8.

Labanowski, D., et al., "Power absorption in acoustically driven ferromagnetic resonance," Appl. Phys. Lett. 108-111, Jan. 15, 2016, pp. 022905-1 to 022905-4.

Dreher, L., et al., "Surface acoustic wave driven ferromagnetic resonance in nickel thin films: Theory and experiment," Physical Review B 86, Oct. 17, 2012, pp. 134415-1 to 134415-13.

Graczyk, P., et al., "Broadband magnetoelastic coupling in magnonic-phononic crystals for high-frequency nanoscale spin-wave generation," Physical Review B 95, Mar. 20, 2017, pp. 104425-1 to 104425-6.

Gowtham, P., et al., "Mechanical back-action of a spin-wave resonance in a magnetoelastic thin film on a surface acoustic wave," Physical Review B 94, Jul. 27, 2016, pp. 014436-1 to 014436-7.

Weiler, M., et al., "Elastically Driven Ferromagnetic Resonance in Nickel Thin Films," Physical Review Letters, PRL 106, Mar. 14, 2011, pp. 117601-1 to 117601-4.

Simpson, E., et al., "Magnetostrictive Fe—Si Thin Films for Tunable Saw Devices," IEEE Transactions on Magnetics, vol. Mag-16, No. 5, Sep. 1980, pp. 919-921.

Robbins, W., et al., "Tunable Surface Acoustic Wave Oscillators Using Magnetostrictive Thin Films," Proceedings of the IEEE, vol. 67, No. 11, Nov. 1979, pp. 1572-1573.

Liu, M., et al., "Voltage Tuning of Ferromagnetic Resonance with Bistable Magnetization Switching in Energy-Efficient Magnetoelectric Composites," Adv. Mater., 25, Jan. 10, 2013, pp. 1435-1439.

* cited by examiner

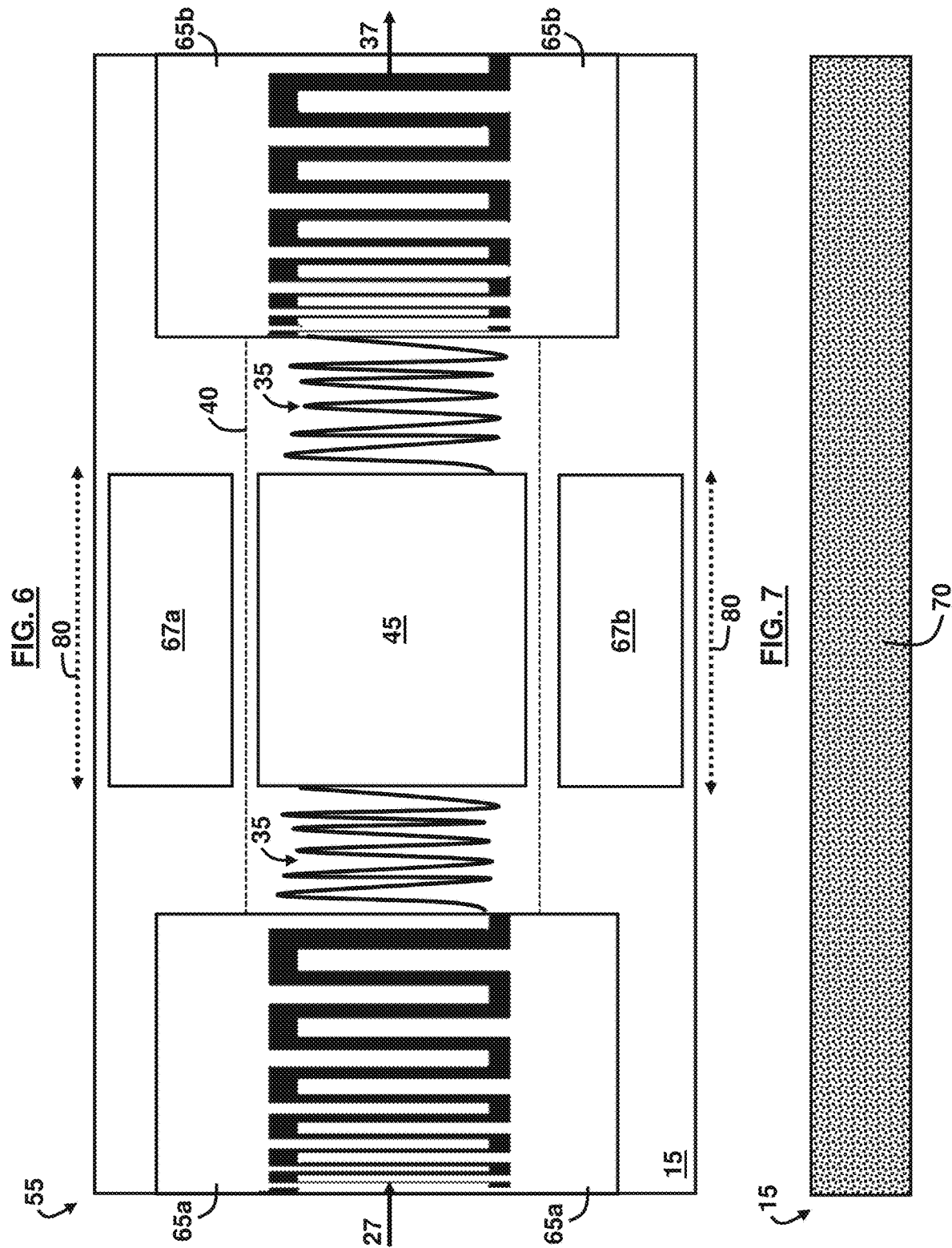

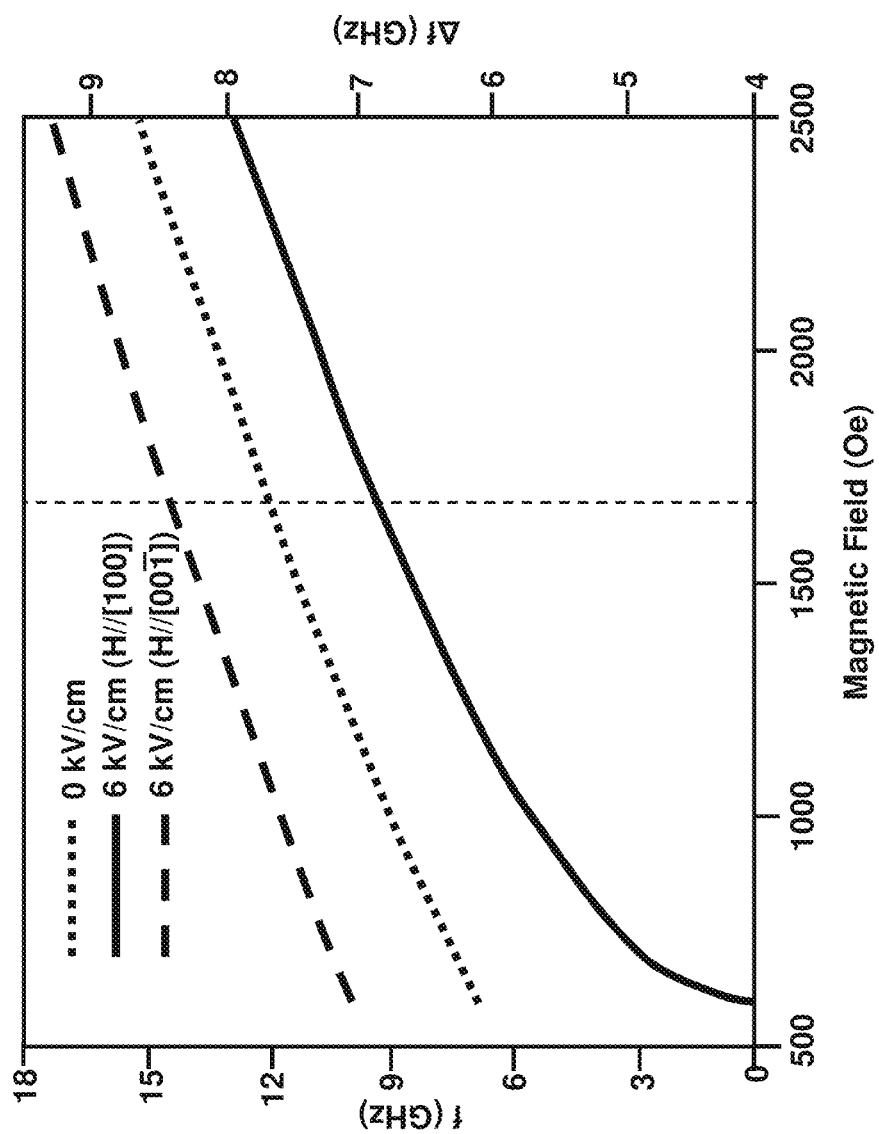

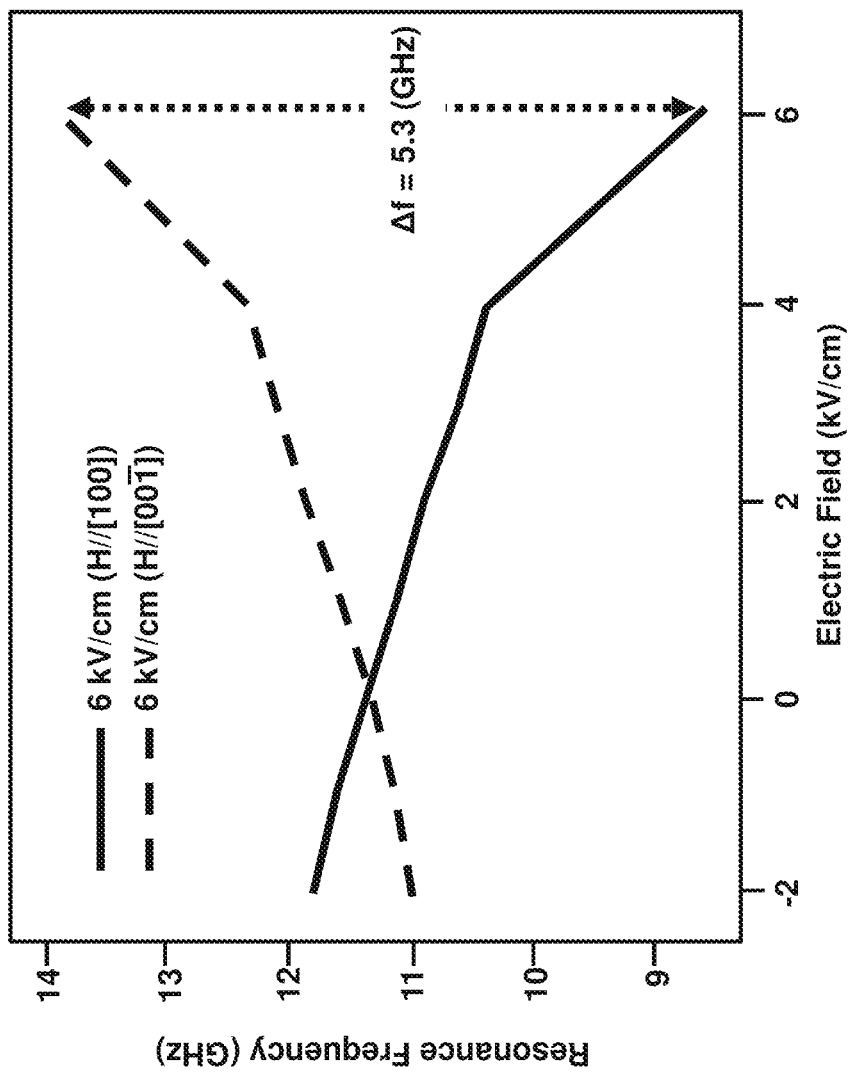

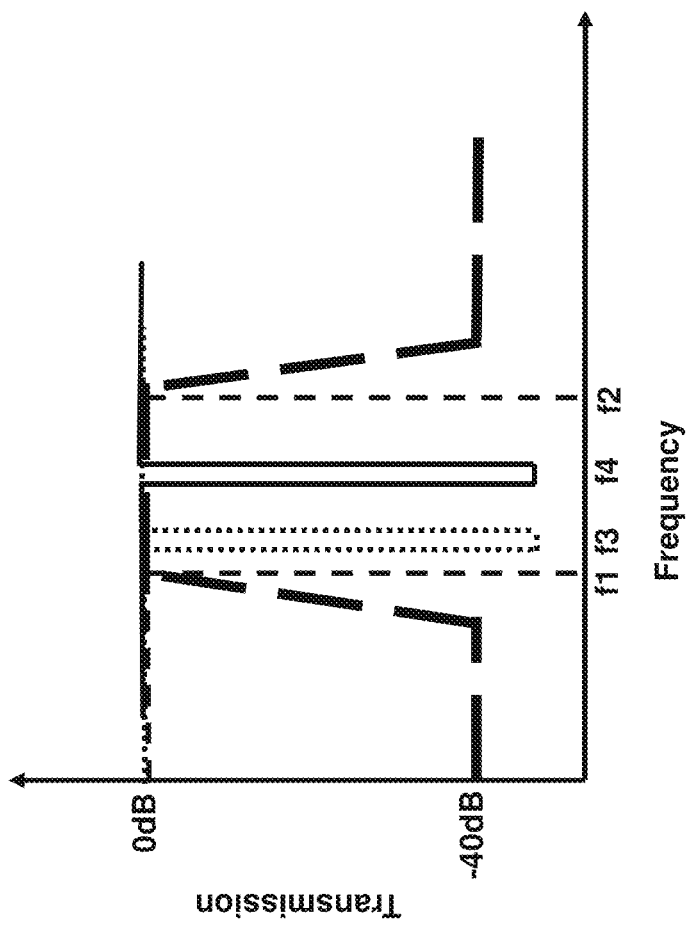

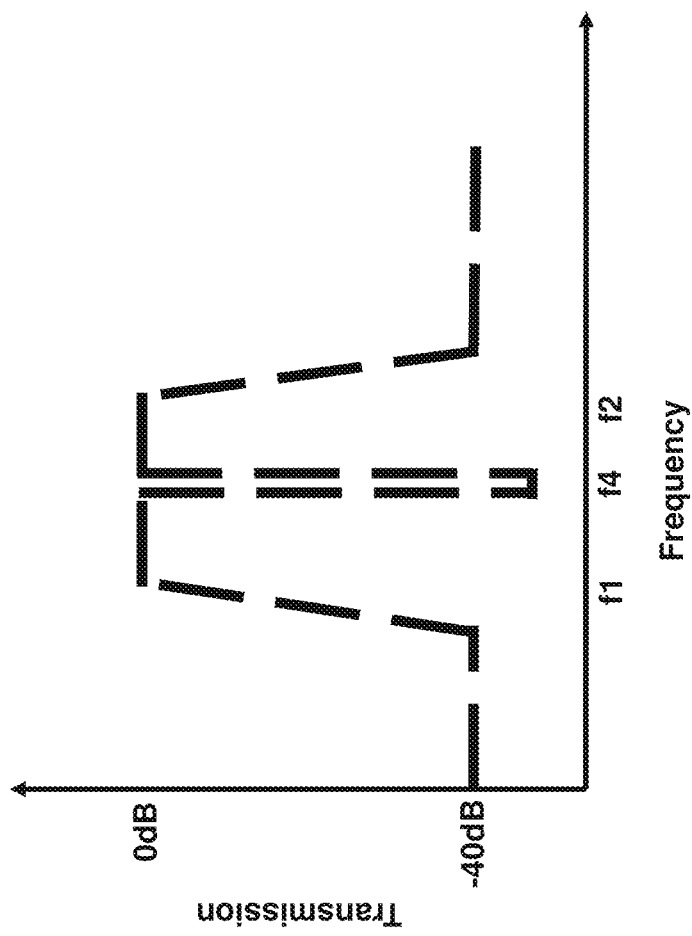

FREQUENCY TUNABLE RF FILTERS VIA A WIDE-BAND SAW-MULTIFERROIC HYBRID DEVICE

CROSS-REFERENCE TO RELATED APPLICATION(S)

This application claims the benefit of U.S. Provisional Patent Application No. 62/555,407 filed on Sep. 7, 2017, which is incorporated herein by reference in its entirety.

GOVERNMENT INTEREST

The invention described herein may be manufactured and used by or for the Government of the United States for all government purposes without the payment of any royalty.

BACKGROUND

Field of the Invention

The embodiments herein generally relate to surface acoustic wave technologies, and more particularly filters using surface acoustic waves.

Background of the Invention

Currently cell phones use frequency static surface acoustic wave (SAW) and bulk acoustic wave (BAW) filters combined together in ladder-like geometries to achieve the needed filtering requirements. These filter banks have several discreet filtering profiles. A typical SAW filter contains electrodes arranged in a comb-like configuration that convert electric signals into surface acoustic waves. The electrodes typically contain a plurality of fingers having equal (e.g., uniform) widths that are evenly spaced apart (e.g., uniform) from one another. SAW devices may be bandpass filters whereby from a mix of incoming multiple RF signals, only the SAW frequencies are allowed to pass therethrough and the rest of the frequencies are blocked. Such filters are used in cell phones, television transmitters, and receivers. However, these filters tend to be fixed frequency filters without tuning capability. Wide-band SAWS are typically not used for filtering because they do not adequately filter the frequencies. There is a strong need for a small (i.e., less than 1 mm$^3$) narrow band filter that has a voltage tunable center frequency. The major issue is that adding bands to mobile devices has become complex and cost inefficient. In order to accomplish this filtering characteristic for mobile devices, a 20% tuning range with less than 3 dB insertion loss is required for applications less than 3.5V but up to 30V, and with a boost circuit and a size not significantly larger than typical SAW/BAW filters. However, achieving these results has not been achieved in the SAW filtering industry.

There are several types of tunable radio frequency (RF) filters. These filtering technologies can generally be categorized as (1) mechanically-tuned filters, (2) electrically-tuned filters, (3) magnetically-tuned-filters, or some combination of these three broad categories. Mechanically-tuned filters generally involve a resonant device, such as a waveguide resonator or a coaxial resonator with a translating plunger or some other sliding structure. The major advantage of these filters is that they can handle very high powers (e.g., 100's of Watts of power). The disadvantages of these filters include slow response (e.g., on the order of seconds) and having a large size (e.g., approximately 330 in$^3$). These mechanically-tuned filters after often connected to actuating motors to enable computer control. Electrically-tuned filters generally include a resonant circuit with a tunable feature, such as a varactor that tunes the capacitance, thereby allowing resonant frequency control. The major advantage of these resonant circuit filters is their fast tuning response (approximately GHz/microsecond). One disadvantage is a relatively low isolation and selectivity. These can be improved through using multiple filters, but at the cost of insertion loss (e.g., the loss of signal power resulting from the insertion of a device in a transmission line). Yttrium iron garnet (YIG) sphere filters are a popular type of magnetically-tunable filter. YIG sphere filters are generally composed a polished YIG sphere encircled with electromagnets and microwave input/output feeds. This YIG sphere absorbs microwave energy at the ferromagnetic resonance (FMR) of the YIG sphere. The FMR frequency tunes to a higher frequency with increased magnetic fields according to the well-known Kittel equation:

$$f = \frac{\gamma}{2\pi}\sqrt{B(B+\mu_0 M)}$$

where M is the magnetization of the ferromagnet and y is the gyromagnetic ratio. While this equation describes the response for a simple isotropic ferromagnet, in the case of anisotropy, the relationship between frequency and field becomes more complicated. In particular, the internal anisotropy fields behave as an effective magnetic field, and modify the frequency with which the system responds. The anisotropy can be modified in materials with magnetostriction by stretching or compressing the material, as in the case of piezoelectrics. Since the anisotropy fields directly affect the resonating frequency, by the simple application of a voltage to a piezoelectric material, the frequency response of the magnetic material can be altered. Also, technically YIG is a ferrimagnet, where the statistical arrangement of atomic magnetic moments are in an unequally opposing direction, thereby leaving a somewhat diminished total magnetization. Therefore, for simplicity the term "ferromagnetic" materials is used to embody ferromagnets, ferrimagnets, and anti-ferromagnets and for simplicity ferromagnetic resonance is used to describe different resonances in ferromagnets, ferrimagnets and anti-ferromagnets, which includes domain wall resonances and other complex dynamic magnetic behavior.

These YIG filters are considered to have a very good balance of metrics, with fairly good speed, good tuning range, good isolation, and good (low) insertion loss. YIG filters can be made fairly small (approximately 1 in$^3$), not including their power supply, which can be bulky. The major disadvantage of these filters is their power consumption which is 100's of milliamps to amps to hold the full range tuned value. There are other filters that fall into the three filter categories including resonators circuits with operational transconductance circuits, magnetostatic wave (<shortwave) based tunable filters, and also filters that can be categorized as being hybrids, such as magnetically tunable resonant circuits that use YIG as a tunable substrate.

Nonetheless, there is not good tunable replacement to acoustic filters in mobile systems. There are many other concepts that have been investigated for filling this for frequency tunable filters for mobile devices. For example, frequency tunable filtering can be accomplished through software defined approaches, but unfortunately these methods can be computationally costly. Creating a "tunable filter"

from filter banks that switch between a large array of narrow-band fixed filters is possible, but unfortunately the size, cost and losses associated with switches/interconnects makes this approach undesirable. MEMs resonators have also been a proposed solution, but unfortunately these devices suffer from very high impedance and very low tuning at microwave frequencies. Tunable acoustic wave filters have also been proposed, but unfortunately the acoustic velocity and/or the dimensional changes are generally much too small to make a good filter.

BRIEF SUMMARY OF THE INVENTION

In view of the foregoing, an embodiment herein provides a filter comprising a piezoelectric substrate; a SAW device on the piezoelectric substrate and comprising interdigitated input and output transducer electrodes comprising unequal widths, wherein the input transducer electrodes are to convert an incoming radio frequency (RF) electrical signal into surface acoustic waves; a SAW propagation path between the input and output transducer electrodes; and a magnetostrictive film in the SAW propagation path to filter the surface acoustic waves that are at a ferromagnetic resonance frequency of the magnetostrictive film, wherein the output transducer electrodes are to convert the filtered surface acoustic waves into an outgoing electrical RF signal. The SAW device may operate in a wide-band pass configuration. The wide-band pass configuration may result in a transmission of frequencies up to −60 dB. The magnetostrictive film may comprise a ferromagnetic material. The interdigitated input and output transducer electrodes comprise unequal widths between adjacent electrode fingers. The magnetostrictive film may absorb energy from the surface acoustic waves. The magnetostrictive film may reflect energy from the surface acoustic waves.

Another embodiment provides a device comprising a piezoelectric substrate; a first set of electrodes on the piezoelectric substrate, wherein the first set of electrodes comprise first electrode fingers that are unevenly spaced apart from one another and which are set to convert an electrical signal having a first electrical profile to a SAW; a second set of electrodes on the piezoelectric substrate, wherein the second set of electrodes comprise second electrode fingers that are unevenly spaced apart from one another and which are set to convert the SAW to an electrical signal having a second electrical profile less than the first electrical profile; and a ferromagnetic material on the piezoelectric substrate and positioned between the first set of electrodes and the second set of electrodes to create a SAW propagation path and to filter a SAW frequency that matches a ferromagnetic resonance frequency of the ferromagnetic material. The first set of electrodes and the second set of electrodes may comprise slanted electrodes. The first set of electrodes and the second set of electrodes may comprise chirped electrodes. The ferromagnetic material may comprise ferrite. The device may comprise a pair of frequency tuning electrodes adjacent to the ferromagnetic material. The device may comprise any of magnonic and phononic crystals on or in the piezoelectric substrate.

Another embodiment provides a method comprising receiving an input radio frequency (RF) electrical signal in an input transducer electrode comprising unevenly spaced electrode fingers having unequal widths; converting the input RF electrical signal into surface acoustic waves; filtering the surface acoustic waves by interacting the surface acoustic waves with a magnetostrictive film to filter the surface acoustic waves that are at a ferromagnetic resonance frequency of the magnetostrictive film; converting the filtered surface acoustic waves into an output RF electrical signal in an output transducer electrode comprising unevenly spaced electrode fingers having unequal widths; and transmitting the output RF electrical signal.

The method may comprise tuning the ferromagnetic resonance frequency of the magnetostrictive film. The method may comprise applying a magnetic field to the magnetostrictive film. The method may comprise applying a DC voltage to electrodes adjacent to or in another direction to the magnetostrictive film to induce a strain that thereby shifts the magnetic dispersion curve to change the frequency of the desired energy reflection or absorption. The method may comprise tuning an external magnetic field adjacent to the magnetostrictive film to shift the magnetic dispersion curve to change the frequency of the desired energy reflection or absorption. The method may comprise providing a piezoelectric substrate adjacent to the magnetostrictive film to allow the surface acoustic waves to propagate from the input transducer electrode to the output transducer electrode; and creating a strain in the piezoelectric substrate. A difference in a strength of the input RF electrical signal and the output RF electrical signal outside the filter band may be less than −1 dB.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 6 is a schematic diagram illustrating a top view of a SAW device, according to an embodiment herein;

FIG. 7 is a schematic diagram illustrating a sectional view of a piezoelectric substrate, according to an embodiment herein;

FIG. 9B is another graph illustrating frequency tuning results achieved by the device and method of the embodiments herein;

FIG. 9D is a graph illustrating the effect of the electric field on the frequency achieved by the device and method of the embodiments herein;

FIG. 10A is a graph illustrating a frequency response of a tunable filter device, according to an embodiment herein;

FIG. 10C is a graph illustrating the frequency response of an acoustically driven ferromagnetic resonance based voltage tunable filter device under a fixed external magnetic field with the application of an external electric field, according to an embodiment herein;

DETAILED DESCRIPTION OF THE INVENTION

Figure 1:
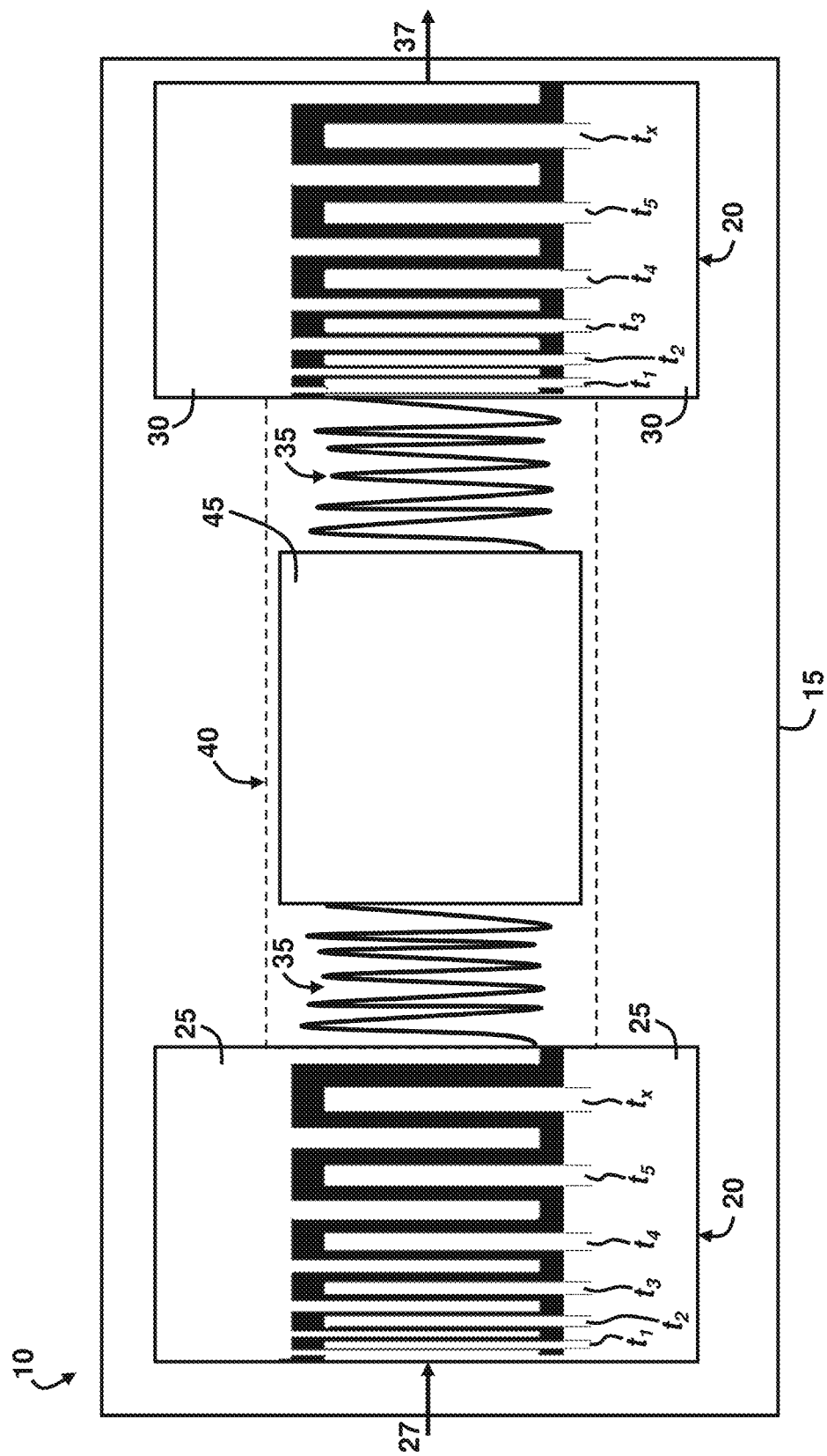
FIG. 1 is a schematic diagram illustrating a top view of a filter, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers and regions may be exaggerated for clarity. The embodiments herein provide a combination of a SAW device that acts as a transmitter and a magnetic material/film that acts as a filter. The embodiments herein replace the multicomponent filter banks of the conventional SAW devices with a single filter. The SAW device includes input and output electrodes, which each comprise electrode fingers that are unequally or unevenly spaced apart from one another and have unequal widths compared to one another. The uneven spacing and widths allows the SAW device to operate in a wide-band configuration. The magnetic material interacts with the surface acoustic waves to filter undesired frequencies. Moreover, the filtering process may be tuned by creating a strain in the underlying piezoelectric substrate, or applying a voltage to the magnetic material, or applying a magnetic field to the magnetic material, or tuning the magnetic field. The embodiments herein result in an out of band insertion loss (e.g., change in the electrical signal) of less than −1 dB. Referring now to the drawings, and more particularly to FIGS. 1 through 15, where similar reference characters denote corresponding features consistently throughout, there are shown exemplary embodiments.

FIG. 1 illustrates a filter 10 comprising a piezoelectric substrate 15. In an example, the piezoelectric substrate 15 comprises materials such as $LiNbO_3$, $LiTiO_3$, ST-Quartz, as well as other types of piezoelectric materials. A SAW device 20 is positioned on the piezoelectric substrate 15 and comprises interdigitated input and output transducer electrodes 25, 30 comprising unequal widths $t_1 \ldots t_x$. Each of the input and output transducer electrodes 25, 30 may be arranged in pairs, respectively. According to an example, the electrodes 25, 30 are metallic electrodes that are deposited on the surface of the piezoelectric substrate 15 in a comb-like configuration, although other configurations are possible. The input transducer electrodes 25, which are the transmitting electrodes for the filter 10, are to convert an incoming radio frequency (RF) electrical signal 27 into surface acoustic waves 35 by generating periodically distributed mechanical forces via a piezoelectric effect. A SAW propagation path 40 is configured between the input and output transducer electrodes 25, 30 to permit transmission of the surface acoustic waves 35, which are acoustic waves that travel across the surface of the piezoelectric substrate 15 having an elasticity with an amplitude that typically decays as it penetrates into the piezoelectric substrate 15. The crystallographic orientations of the material of the piezoelectric substrate 15 dictates the SAW propagation characteristics and the crystallographic orientations of the magnetostrictive material (filtering media) dictate the location and layout of the DC-low frequency electrodes to enable shifting of the magnetic dispersion curve.

A magnetostrictive film 45 is provided in the SAW propagation path 40. The surface acoustic waves 35 interact with the magnetostrictive film 45 in the SAW propagation path 40. The magnetostrictive film 45 filters the surface acoustic waves 35 that are at a ferromagnetic resonance frequency of the magnetostrictive film 45. The output transducer electrodes 30, which are the receiving electrodes for the filter 10, are to convert the filtered surface acoustic waves 35 into an outgoing electrical RF signal 37. Composite multiferroic properties are effectively the mating the piezoelectric materials of the substrate 15 with the magnetostrictive film 45 to provide voltage tunable magnetic properties, which may result in shape changing of the magnetostrictive film 45 due to the magnetization. The resonance frequency depends on the external magnetic field near the magnetostrictive film 45. In accordance with the embodiments herein, the SAW device 20 operates in a wide-band pass configuration, wherein the magnetostrictive film 45 performs the filtering instead of the SAW device 20, which is contrary to the conventional SAW techniques.

Figure 2:
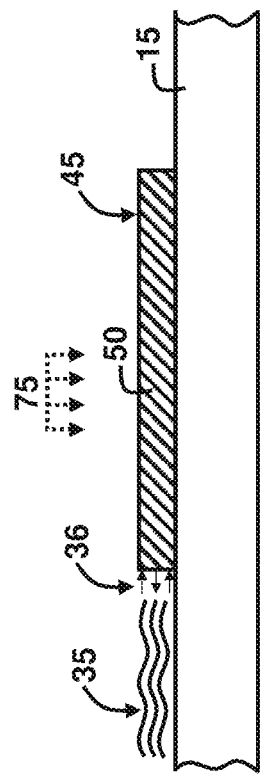
FIG. 2 is a schematic diagram illustrating a sectional view of magnetostrictive film on a piezoelectric substrate, according to an embodiment herein.

The wide-band pass configuration may result in a transmission of frequencies up to −60 dB. As illustrated in FIG. 2, with reference to FIG. 1, the magnetostrictive film 45 may comprise a ferromagnetic material 50 such as ferrite, for example. Ferromagnetic resonance is the precessional motion of magnetic moments in the ferromagnetic material 50 in the presence of an external magnetic field 75. The external magnetic field 75 exerts a torque on the magnetic moments in the ferromagnetic material 50 causing the magnetic moments to precess. Some example ferromagnetic resonance excitation methods used in accordance with the embodiments herein include microwave excitation, and acoustically driven magnetoelastic excitation. The precession frequency and dispersion (wavelength-frequency relationship) of the magnetization depends on the orientation of the ferromagnetic material 50, the strength of the magnetic field 75, as well as the macroscopic magnetization of the ferromagnetic material 50.

Inherent magnetic bias is critical to enabling miniature voltage-tunable devices without the need of external electromagnets. Using a magnetic bias scheme, the filter 10 can operate without the need for an external electromagnet or a fixed field electromagnet. There are several forms of magnetic bias, which can be used to provide a fixed magnetic field 75, thus setting the resting ferromagnetic resonance frequency of the magnetostrictive film 45. Examples of the magnetic bias that can be used are exchange bias, dipolar bias, strain-based bias, as well as others. Moreover, inherent magnetic bias can be used to spatially pattern the frequency as well.

In the presence of the external magnetic field 75 and at a ferromagnetic resonance frequency of the magnetostrictive film 45, the magnetostrictive film 45 becomes highly absorbing (i.e., the magnetostrictive film 45 results in a transmission of frequencies up to −60 dB) and other frequencies within the pass-band of the SAW device 20 are allowed to transmit surface acoustic waves 35 in the form of spin waves through the magnetostrictive film 45. In an exemplary embodiment, the magnetostrictive film 45 has a low insertion loss (i.e., less than −1 dB) and a high magnetostriction coefficient (i.e., approximately $2 \times 10^{-9}$ $A^{-1}$ m), which allows for efficient coupling of the surface acoustic waves 35 into the magnetostrictive film 45 for ferromagnetic resonance excitation. In an example, the ferromagnetic resonance frequency of the magnetostrictive film 45 can be tuned by the external magnetic field 75. The surface acoustic waves 35 are then converted back to an electrical RF signal 37 at the output transducer electrodes 30.

Figure 3A:
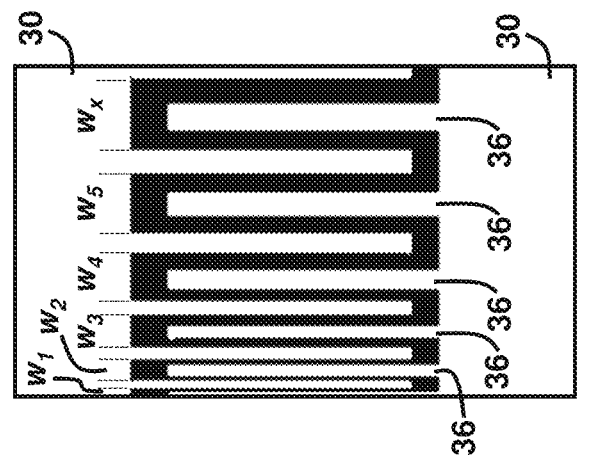
FIG. 3A is a schematic diagram illustrating a top view of a first set of electrodes arranged with uneven spacing between electrode fingers, according to an embodiment herein.
Figure 3B:
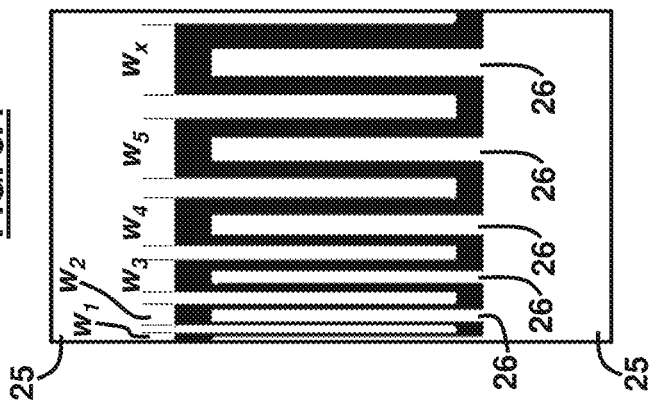
FIG. 3B is a schematic diagram illustrating a top view of a second set of electrodes arranged with uneven spacing between electrode fingers, according to an embodiment herein.

RF energy absorption can induce precession of the ferromagnetic resonance of the magnetostrictive film 45, and RF energy emission can dampen the precession. As such, the magnetostrictive film 45 may absorb energy 36 from the surface acoustic waves 35. The magnetostrictive film 45 may reflect energy 36 from the surface acoustic waves 35. As shown in FIGS. 3A and 3B, with reference to FIGS. 1 and 2, the interdigitated input and output transducer electrodes 25, 30 may comprise unequal widths $w_1 \ldots w_x$ between adjacent electrode fingers 26, 36, respectively.

In some examples, the SAW device 20 may be utilized as a resonator for fixed frequency generation (similar to crystal oscillators), or as chemical and biosensors that may utilize acoustic waves interacting with a surrounding physical parameter (e.g., biomolecule, chemicals, etc.) that causes a change in the frequency response, phase response, and insertion loss of the SAW device 20. This change can be correlated with the presence of external physical parameter. In another example, the SAW device 20 may be used as a temperature, pressure, or stress sensor.

The filter 10 is a compact frequency tunable RF/microwave filter, which combines a surface acoustic wave (SAW) device 20 with a magnetostrictive film 45 containing ferromagnetic material 50 that functions as the active RF filtering material in the filter 10. As used herein, the term ferromagnetic material 50 includes a ferrimagnetic or antiferromagnetic material. Instead of typical fixed frequency SAW filters that are prevalent in mobile devices such as cell phones, the SAW device 20 is configured to be wide-band pass and functions as the acoustic transmitting agent as opposed to being used as a filtering agent. The filter 10 fills an important need for tunable filters that are ultra-small (i.e., <<1 mm³), have a low insertion loss, are fast, and have a wide tuning frequency range.

Figure 4:
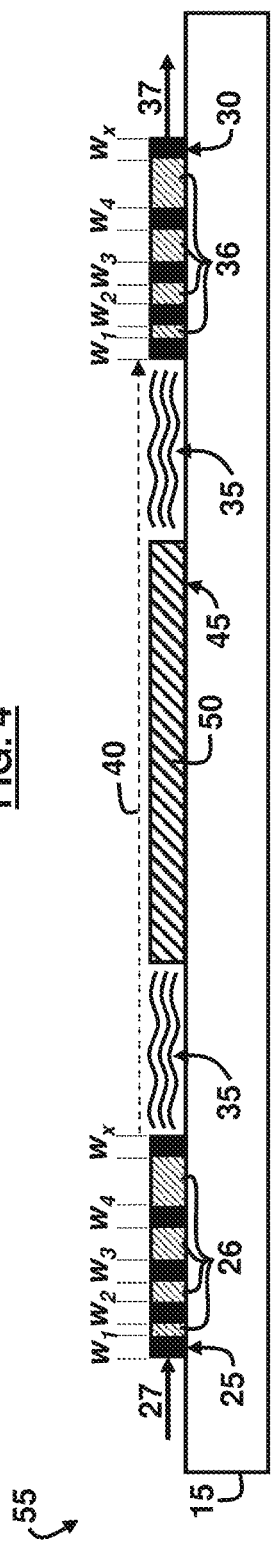
FIG. 4 is a schematic diagram illustrating a sectional view of a SAW device, according to an embodiment herein.

FIG. 4, with reference to FIGS. 1 through 3B, illustrates a device 55 comprising a piezoelectric substrate 15; a first set of electrodes 25 on the piezoelectric substrate 15, wherein the first set of electrodes 25 comprise first electrode fingers 26 that are unevenly spaced apart (e.g., unequal widths $w_1 \ldots w_x$) from one another and which are set to convert an electrical signal 27 having a first electrical profile to a SAW 35; a second set of electrodes 30 on the piezoelectric substrate 15, wherein the second set of electrodes 30 comprise second electrode fingers 36 that are unevenly spaced apart (e.g., unequal widths $w_1 \ldots w_x$) from one another and which are set to convert the SAW 35 to an electrical signal 37 having a second electrical profile less than the first electrical profile; and a ferromagnetic material 50 on the piezoelectric substrate 15 and positioned between the first set of electrodes 25 and the second set of electrodes 30 to create a SAW propagation path 40 and to filter a SAW frequency of the SAW 35 that matches a ferromagnetic resonance frequency of the ferromagnetic material 50.

Figure 5:
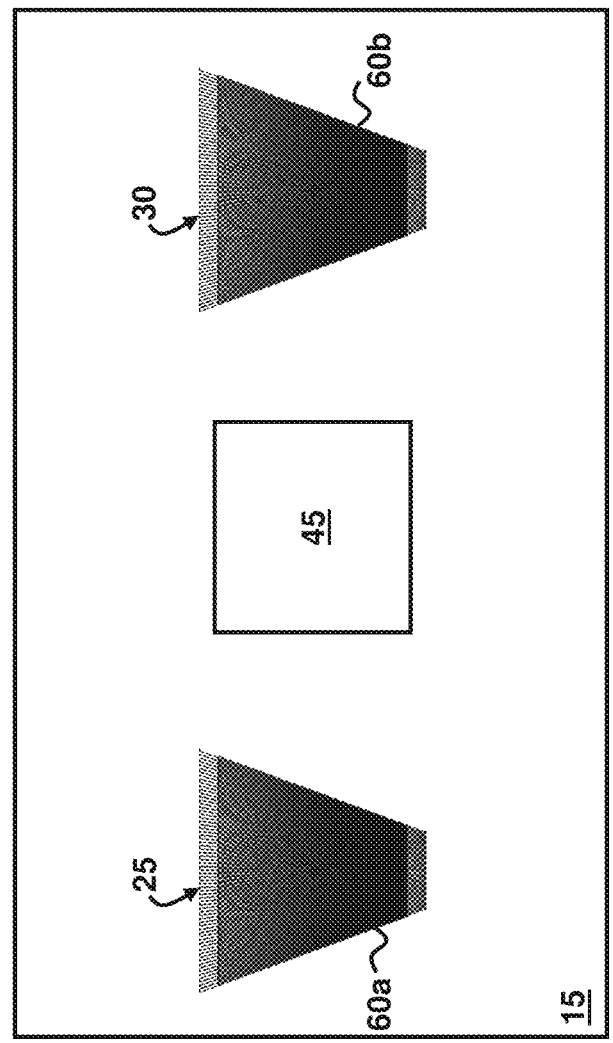
FIG. 5 is a schematic diagram illustrating slanted electrodes, according to an embodiment herein.

As shown in FIG. 5, with reference to FIGS. 1 through 4, the first set of electrodes 25 and the second set of electrodes 30 may comprise slanted electrodes 60a, 60b, respectively. As shown in FIG. 6, with reference to FIGS. 1 through 5, the first set of electrodes 25 and the second set of electrodes 30 may comprise chirped electrodes 65a, 65b. Each of the chirped electrodes 65a, 65b may be arranged in pairs, respectively. The device 55 may comprise a pair of frequency tuning electrodes 67a, 67b adjacent to the ferromagnetic material 50, and an electric field 80 (i.e., DC electric field, for example) may be applied to the electrodes 67a, 67b. In an example, the ferromagnetic material 50 may comprise ferrite. The device 55 may comprise any of magnonic and phononic crystals 70 on or in the piezoelectric substrate 15, as indicated in FIG. 7, with reference to FIGS. 1 through 6.

Figure 8:
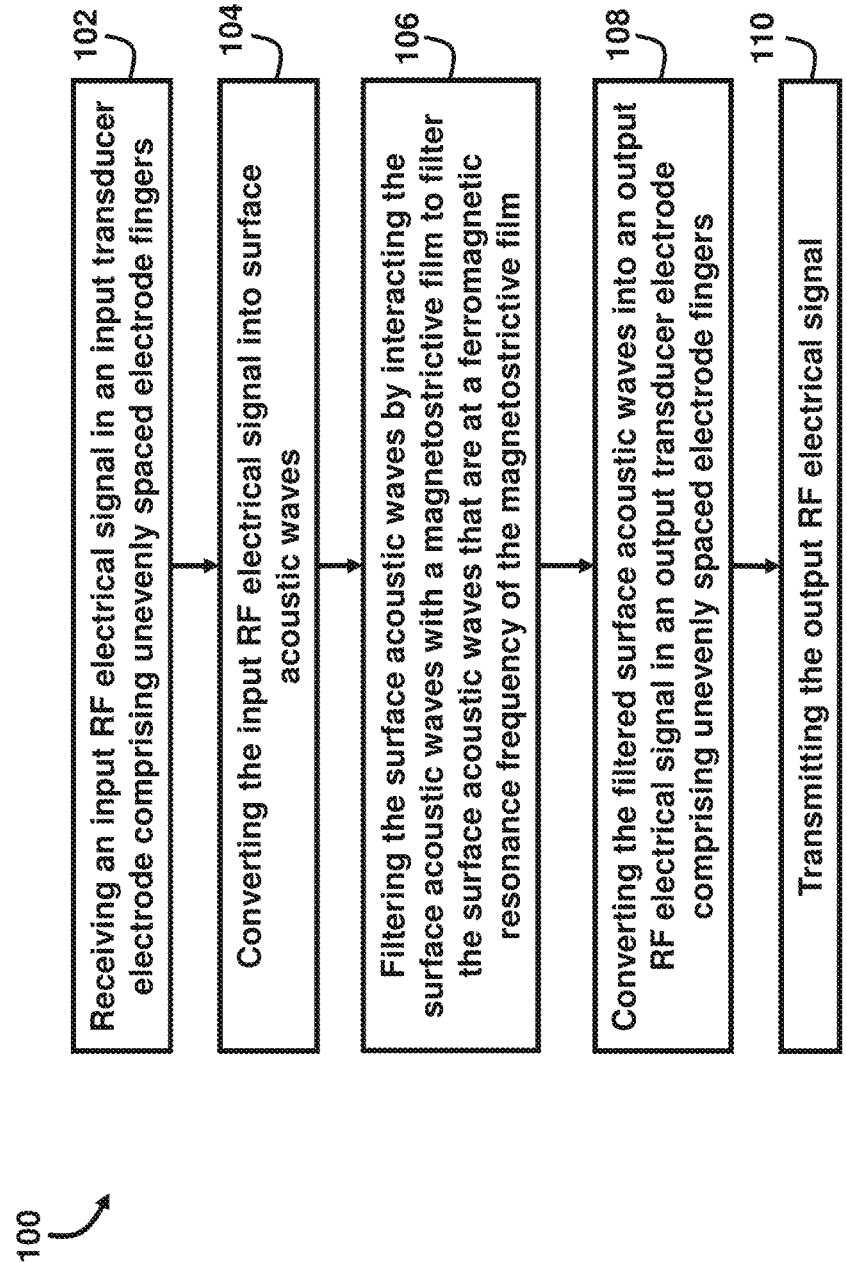
FIG. 8 is a flow diagram illustrating a method, according to an embodiment herein.

FIG. 8, with reference to FIGS. 1 through 7, illustrates a method 100 according to another embodiment herein. Block 102 describes receiving an input RF electrical signal 27 in an input transducer electrode 25 comprising unevenly spaced electrode fingers 26 having unequal widths $t_1 \ldots t_x$. Block 104 describes converting the input RF electrical signal 27 into surface acoustic waves 35. Block 106 describes filtering the surface acoustic waves 35 by interacting the surface acoustic waves 35 with a magnetostrictive film 45 to filter the surface acoustic waves 35 that are at a ferromagnetic resonance frequency of the magnetostrictive film 45. Block 108 describes converting the filtered surface acoustic waves 35 into an output RF electrical signal 37 in an output transducer electrode 30 comprising unevenly spaced electrode fingers 36 having unequal widths $t_1 \ldots t_x$. Block 110 describes transmitting the output RF electrical signal 37.

The method 100 may comprise tuning the ferromagnetic resonance frequency of the magnetostrictive film 45. The method 100 may comprise applying a magnetic field to the magnetostrictive film 45. The method 100 may comprise applying a DC voltage to the electrodes 67a, 67b that are adjacent to or in another direction to the magnetostrictive film 45. This voltage creates a strain in the piezoelectric substrate 15, which transfers to the magnetostrictive film 45, which then creates a change in the ferromagnetic resonance frequency and/or changes in the magnetic dispersion curves. The method 100 may comprise tuning an external magnetic field adjacent to the magnetostrictive film 45 to shift the magnetic dispersion curve to change the frequency of the desired energy reflection or absorption. The method 100 may comprise providing the piezoelectric substrate 15 adjacent to the magnetostrictive film 45 to allow the surface acoustic waves 35 to propagate from the input transducer electrode 25 to the output transducer electrode 30. The method 100 may comprise creating a strain in the piezoelectric substrate 15. A difference in a strength of the input RF electrical signal 27 and the output RF electrical signal 37 outside the filter band may be less than −1 dB.

Figure 9A:
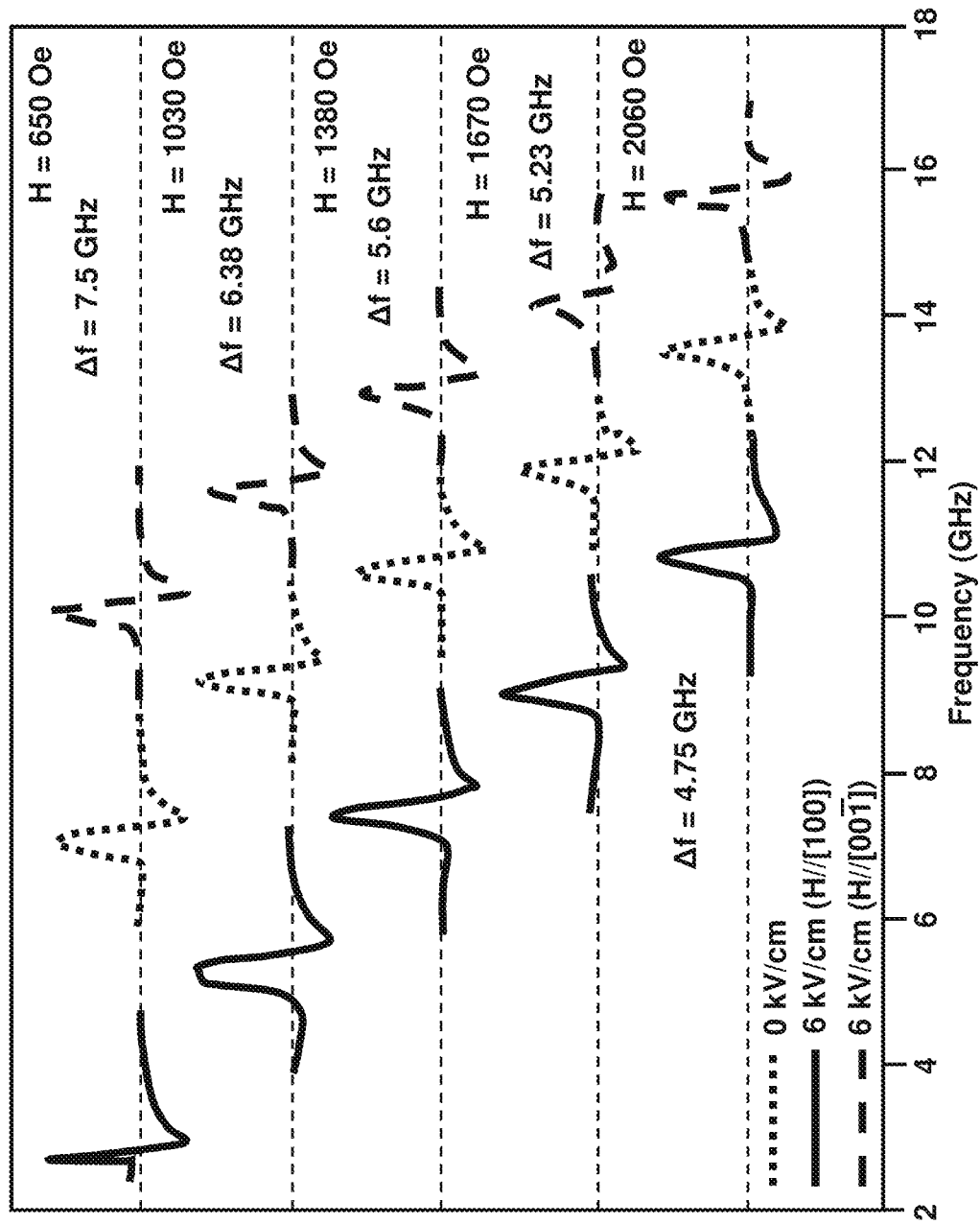
FIG. 9A is a graph illustrating frequency tuning results achieved by the device and method of the embodiments herein.

FIGS. 9A through 9D, with reference to FIGS. 1 through 8, are graphs illustrating results achieved by the method 100 provided by the embodiments herein. The graphs of FIGS. 9A through 9D demonstrate that frequency tuning is achievable using the external magnetic field 75. The results presented in FIGS. 9A through 9D is based on a magnetostrictive film 45 comprising FeGaB/PZN-PT [001]. In FIG. 9A, the frequency is measured at five different magnetic field levels (e.g., H=650 Oe, H=1030 Oe, H=1380 Oe, H=1670 Oe, and H=2060 Oe) for three different levels of the electric field (e.g., 0 kV/cm, 6 kV/cm (H//[100]), and 6 kV/cm (H//[01$\bar{1}$])), and shows that the frequency may be changed as the magnetic field 75 and electric field 80 changes.

Figure 9C:
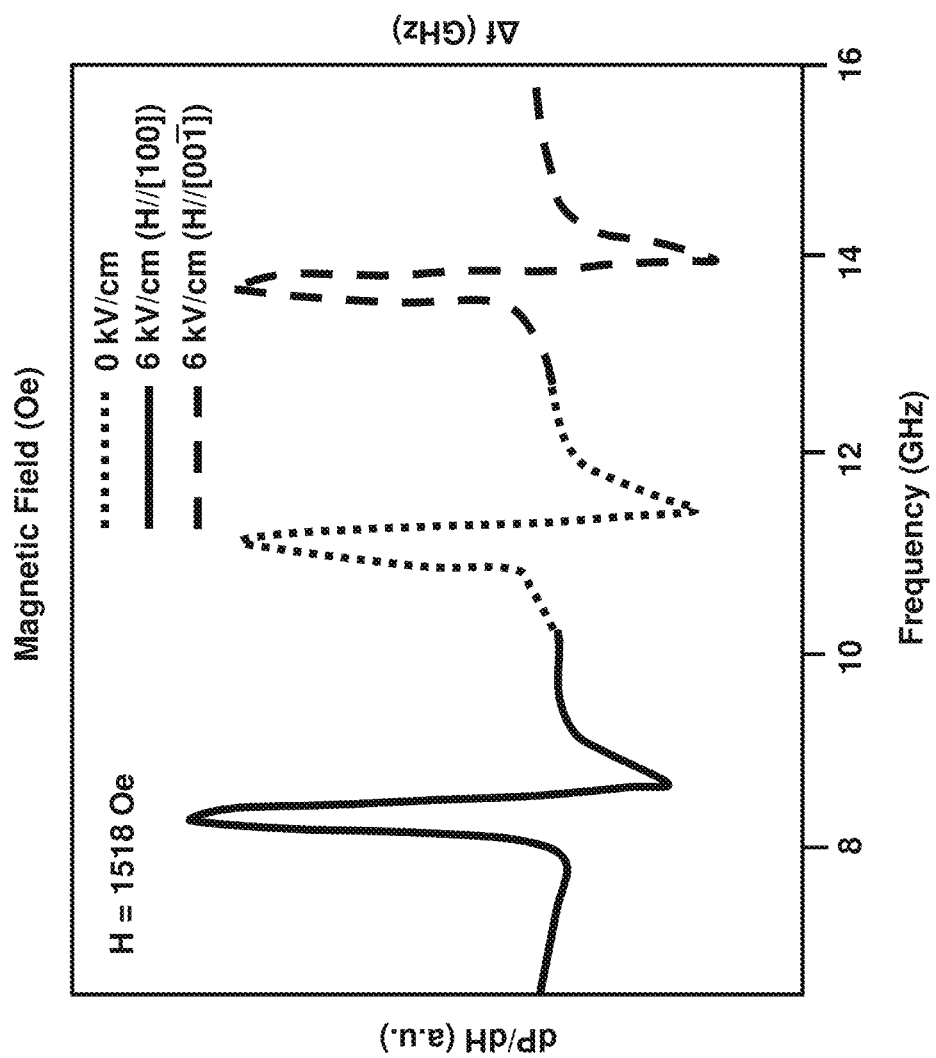
FIG. 9C is a graph illustrating the effect of the magnetic field on the frequency achieved by the device and method of the embodiments herein.

In FIG. 9B, the results show that as the magnetic field 75 increases, so does the measured frequency, which again shows that frequency tuning is achieved. In FIG. 9C, the results are displayed for the magnetic field, and in FIG. 9D, the results are displayed for the electric field 80, both indicating that the frequency may be tuned based on changes to the magnetic field 75 and/or electric field 80 near the (or applied to) the magnetostrictive film 45.

Figure 10B:
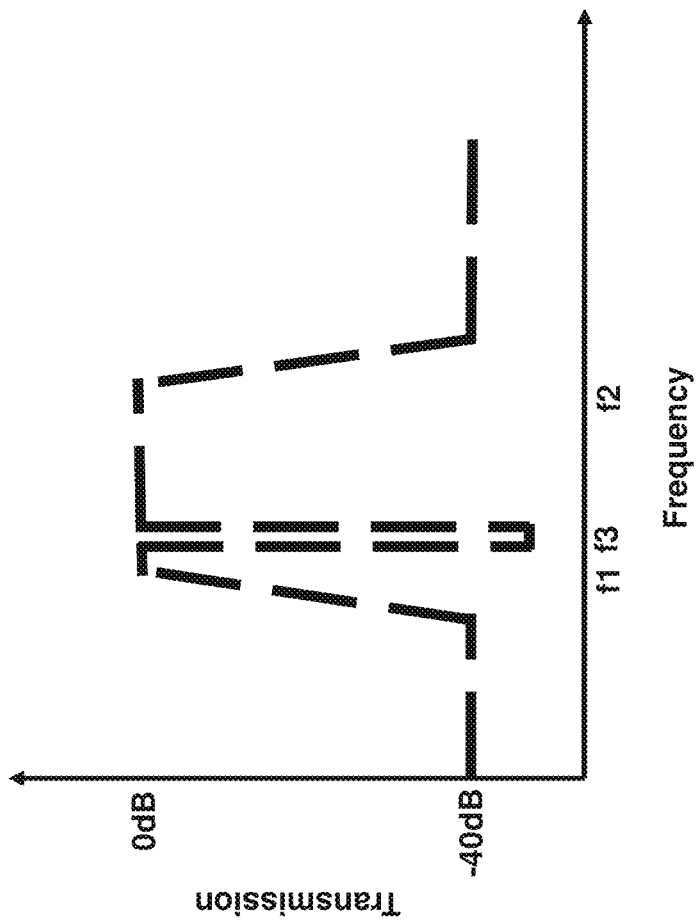
FIG. 10B is a graph illustrating the frequency response of an acoustically driven ferromagnetic resonance based voltage tunable filter device under a fixed external magnetic field, according to an embodiment herein.

FIGS. 10A through 10C, with reference to FIGS. 1 through 9D, illustrate graphs representing the frequency response of a voltage tunable filter device 55. FIG. 10A shows the frequency response of chirped electrodes 65a, 65b. In FIG. 10A, f1 and f2 represent the start and stop frequencies of a wide band filter. Also shown is the inherent ferromagnetic resonance absorption frequency of the magnetostrictive film 45 (denoted as f3) under a fixed external magnetic field 75. Under application of an external DC electric field 80 to the piezoelectric substrate 15 (or changing the fixed external magnetic field 75), the ferromagnetic resonance absorption frequency can be shifted (denoted by f4).

FIG. 10B shows the frequency response of an acoustically driven ferromagnetic resonance based voltage tunable filter device 55 under a fixed external magnetic field 75. FIG. 10C shows the frequency response of an acoustically driven ferromagnetic resonance based voltage tunable filter device 55 under fixed external magnetic field and with the application of the external electric field 80.

FIG. 10B shows the ideal state frequency response of the tunable filter device 55. Frequency f3 is blocked with high isolation (>−40 dB). All other frequencies between f1 and f2 are transmitted with minimal loss (<−1 dB). If it is desired to change the frequency of bandgap frequency within the pass-band (f1-f2), under the application of a DC electric field 80 to the electrodes 67a, 67b (which causes a DC strain in the magnetostrictive film 45 shifting the ferromagnetic resonance), the frequency response of the device 55 can be quickly changed to as shown in FIG. 10C, where f4 is the frequency being blocked completely. The device 55 assumes operation under a fixed external magnetic field 75 or inherent bias.

Figure 11A:
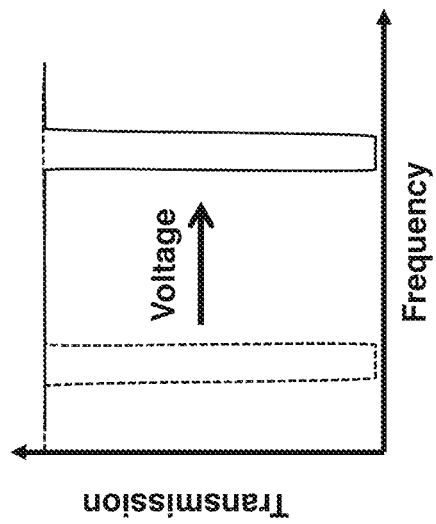
FIG. 11A is a graph illustrating the relationship of the ferromagnetic resonance frequency vs. voltage in a tunable band-gap radio frequency filter device, according to an embodiment herein.
Figure 11B:
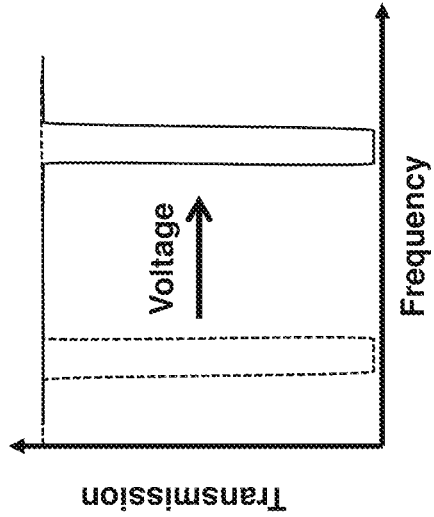
FIG. 11B is a graph illustrating the frequency response for a tunable band-gap radio frequency filter device, according to an embodiment herein.
Figure 11C:
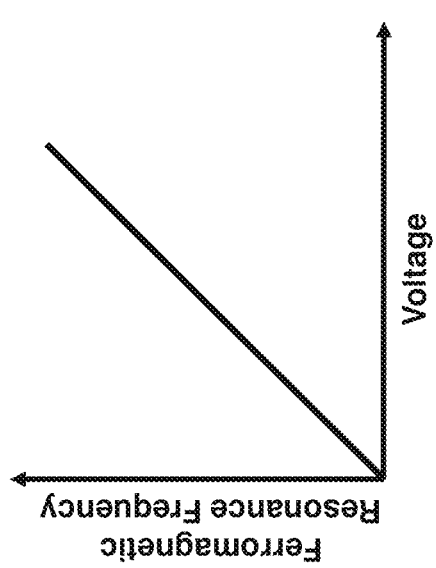
FIG. 11C is a graph illustrating the relationship of the ferromagnetic resonance frequency vs. voltage in a tunable band-gap radio frequency filter device with a uniform bias, according to an embodiment herein.
Figure 11D:
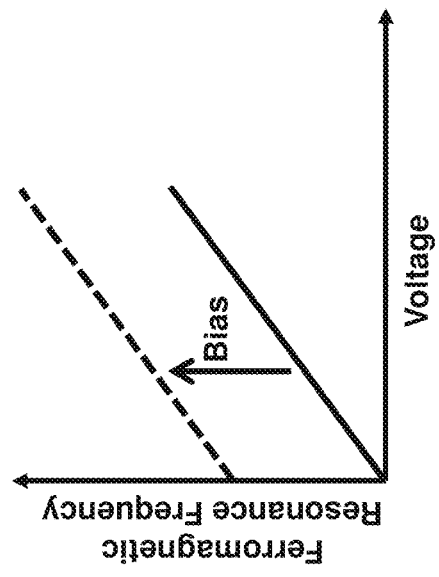
FIG. 11D is a graph illustrating the frequency response for a tunable band-gap radio frequency filter device with a uniform bias, according to an embodiment herein.

FIGS. 11A through 14C, with reference to FIGS. 1 through 10C, illustrate various embodiments herein as further described below. FIG. 11A illustrates a graph showing the relationship of ferromagnetic resonance vs. voltage for the device 55. FIG. 11B illustrates a graph showing the wave transmission profile of the magnetostrictive film 45 containing ferrite as a DC voltage 80 is applied to the electrodes 67a, 67b. FIG. 11C illustrates a graph showing the relationship of ferromagnetic resonance vs. voltage for the device 55 as a result of using an exchange bias or a dipolar bias creating a shift on the y-axis of the ferromagnetic resonance frequency. FIG. 11D illustrates a graph showing the wave transmission profile of the magnetostrictive film 45 containing ferrite with a uniform bias.

Figure 12B:
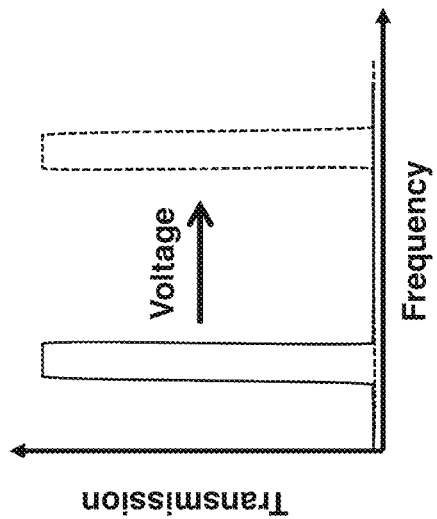
FIG. 12B is a graph illustrating the frequency response for a tunable band-gap radio frequency filter device with a bias notch, according to an embodiment herein.
Figure 12A:
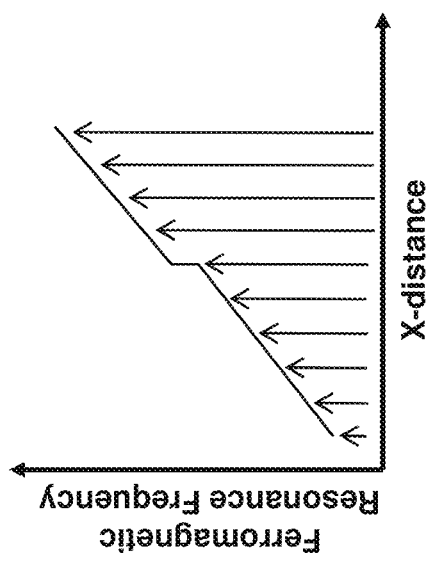
FIG. 12A is a graph illustrating the relationship of the ferromagnetic resonance frequency vs. voltage in a tunable band-gap radio frequency filter device with a bias notch, according to an embodiment herein.

FIG. 12A illustrates a graph showing the x-axis bias profile of the magnetostrictive film 45, and FIG. 12B illustrates a graph showing the wave transmission profile of the magnetostrictive film 45 containing ferrite with an x-axis bias profile. As indicated by FIGS. 11A through 12B, several different transmission profiles of filters 10 and devices 55 may be created by patterning the resting magnetic bias (i.e., resting ferromagnetic resonance frequency). This patterning can be achieved through heat-assisted magnetic recording, for example. In the case of FIG. 12A, the magnetic pattern is written such that the x-axis magnetic bias profile with a notch creates a band-pass filter for the magnetostrictive film 45. Furthermore, this patterning (as well as typically lithography or other patterning) can be used to switch the filtering mechanism from absorption to reflection/diffraction through the use of magnonic or phononic crystals 70 on or in the piezoelectric substrate 15.

Figure 13A:
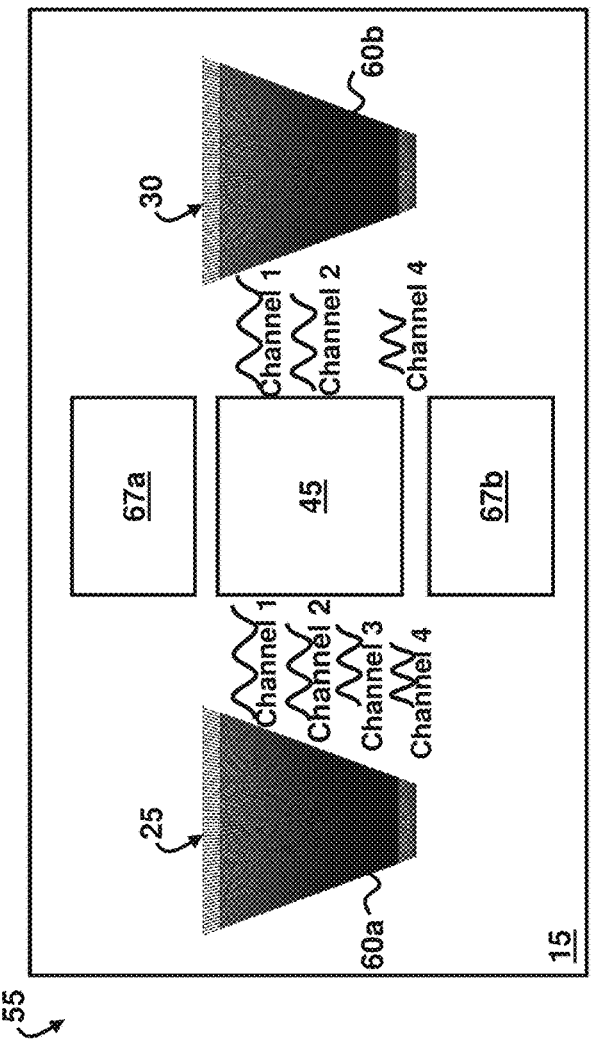
FIG. 13A is a schematic diagram illustrating a tunable filter device with slanted electrodes creating channelized surface acoustic waves, according to an embodiment herein.
Figure 13C:
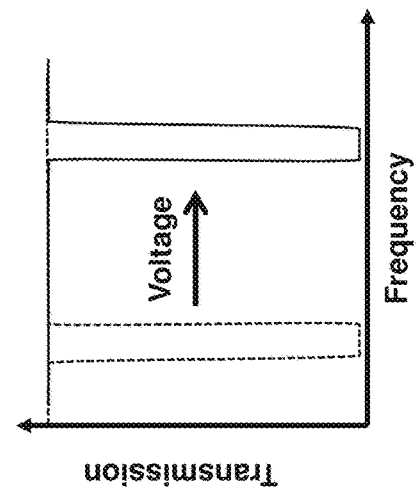
FIG. 13C is a graph illustrating the frequency response for a tunable filter device with slanted electrodes creating channelized surface acoustic waves, according to an embodiment herein.
Figure 13B:
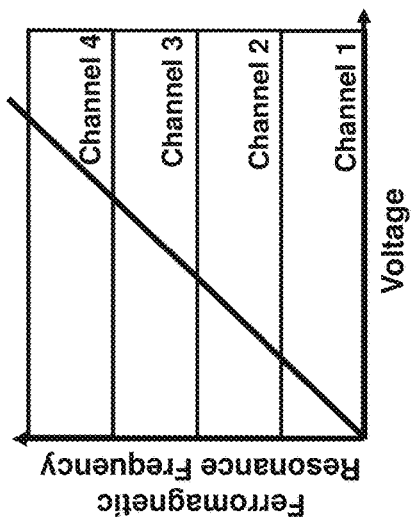
FIG. 13B is a graph illustrating the relationship of the ferromagnetic resonance frequency vs. voltage in a tunable filter device with slanted electrodes creating channelized surface acoustic waves, according to an embodiment herein.

FIG. 13A illustrates an example of the device 55 using slanted electrodes 60a, 60b to create wideband SAWs. With this approach the different frequency signals are separated in space and thus channelized (e.g., Channels 1-4) allowing even more flexibility when magnetic patterning is applied. FIG. 13B illustrates a graph showing the relationship of ferromagnetic resonance vs. voltage for the device 55 as provided in FIG. 13A. FIG. 13C illustrates a graph showing the wave transmission profile of the magnetostrictive film 45 containing ferrite with a uniform bias, as provided in FIG. 13A.

Figure 14A:
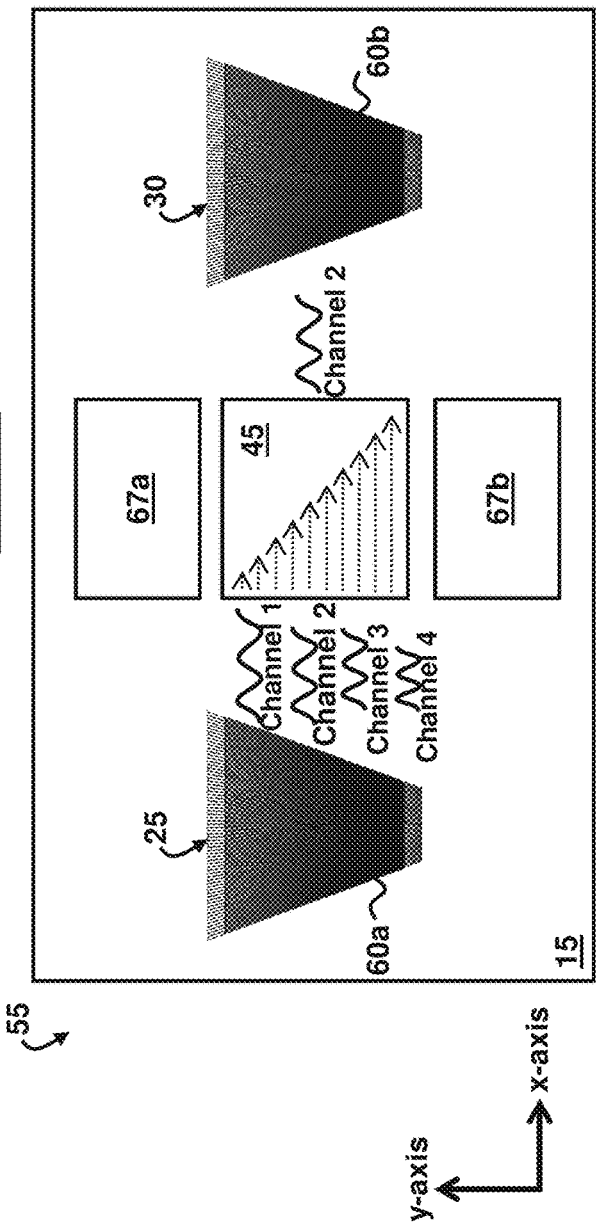
FIG. 14A is a schematic diagram illustrating a tunable filter device with slanted electrodes creating channelized surface acoustic waves and a y-axis bias profile, according to an embodiment herein.
Figure 14C:
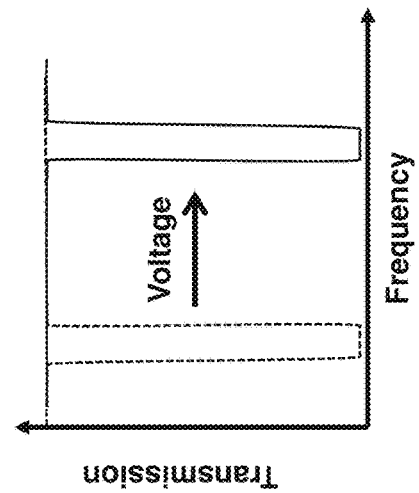
FIG. 14C is a graph illustrating the frequency response for a tunable filter device with slanted electrodes creating channelized surface acoustic waves and a y-axis bias profile, according to an embodiment herein.
Figure 14B:
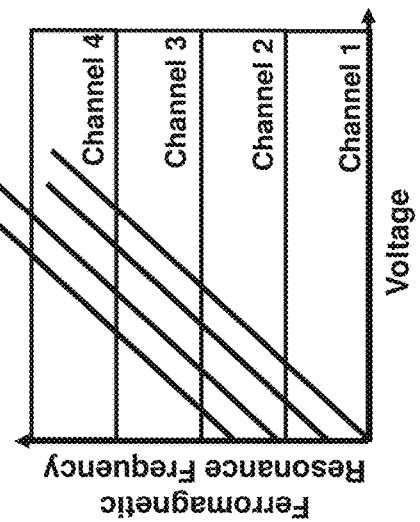
FIG. 14B is a graph illustrating the relationship of the ferromagnetic resonance frequency vs. voltage in a tunable filter device with slanted electrodes creating channelized surface acoustic waves and a y-axis bias profile, according to an embodiment herein.
Figure 15:
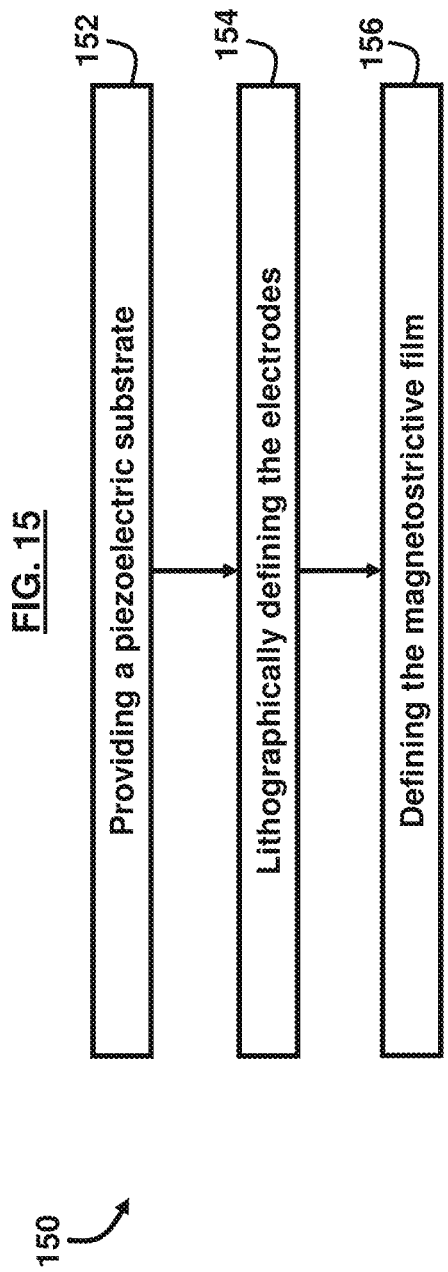
FIG. 15 is a flow diagram illustrating a manufacturing process, according to an embodiment herein.

FIG. 14A illustrates another example of the device 55 using slanted electrodes 60a, 60b to create wideband SAWs with a y-axis bias profile. The different frequency signals are separated in space and thus channelized (e.g., Channels 1-4). FIG. 14B illustrates a graph showing the relationship of ferromagnetic resonance vs. voltage for the device 55 as provided in FIG. 14A. FIG. 14C illustrates a graph showing the wave transmission profile of the magnetostrictive film 45 containing ferrite with a y-axis bias profile, as provided in FIG. 14A.

The embodiments herein provide a frequency tunable RF filter 10 and device 55 that combines a static surface acoustic wave filter device 20 with the tunable filtering properties enabled by ferromagnetic resonance in ferromagnetic/ferrimagnetic materials (i.e., magnetostrictive film 45). The filter 10 and device 55 achieve significant tuning ranges (several GHz) with good speed (several GHz/ms), small size (mm$^3$ scale), good out-of-band transmission/reflection/absorption properties, good in-band transmission/reflection/absorption properties and low power consumption. The embodiments herein address a strong need for a microfabricated miniature tunable band-filter that has the ability to operate at frequencies from 100 MHz-up to 100 GHz. An example of this need is in revolutionizing cell-phone technology.

The embodiments herein provide a wide-frequency band surface acoustic wave device 55 comprising input/transmitter and output/receiver interdigitated electrodes 25, 30, a magnetostrictive film 45 containing ferromagnetic or ferrimagnetic material 50 intimately bound to a piezoelectric substrate 15 with adjacent tuning electrodes 67a, 67b. The magnetostrictive film 45 is configured such that the ferromagnetic/ferrimagnetic resonance (FMR) is well defined at zero field (~1 MHz, without an external magnetic field 75) through some method of inherent bias, such as an exchange bias film(s), dipolar bias film(s), strain bias through residual stress, or other bias techniques, such as chemical treatment such a plasma treatment, ion-Beam or other chemical treatment.

As described above, there are two sets of wide-band interdigitated electrodes (IDTS) 25, 30 that are in intimate contact with a ferroelectric or piezoelectric substrate 15. However, the two sets of electrodes 25, 30 are configured to be wide-band pass, instead of conventional fixed frequency SAW filters, which typically have a narrow band-pass. Typical narrow band SAW filters are formed from two sets of interdigitated electrodes with uniform spacing and uniform electrode widths where these spatial dimensions dictate the wavelength of the acoustic waves. Whereas, the wideband SAW device 20 is created by making non-uniform electrode spacing $w_1 \ldots w_x$ and electrode widths $t_1 \ldots t_x$. The embodiments herein provide for different types of wide-band SAW devices 20, including having slanted electrodes 60a, 60b and chirped electrodes 65a, 65b. Both of the types electrodes 60a, 60b or 65a, 65b are good choices for the embodiments herein. These filters/devices require these types of distinct wide-band electrode layouts 10, 55, whereas otherwise these electrode layouts are generally not useful for filter applications because they are wide-band pass and thus would typically act effectively like a transmission line as opposed to a filter.

The first set of input electrodes 25 is used to convert the RF electric signals 27 to RF surface acoustic waves 35. Then, the surface acoustic waves 35 travel across the surface of the piezoelectric substrate 15, where they travel across the region (e.g., SAW propagation path 40) that has the magnetostrictive film 45. At FMR, the film 45 is highly absorbing (e.g., high isolation (60 dB), whereas at frequencies that do not match FMR or other spin-wave conditions the magnetostrictive film 45 has low loss and therefore is highly transmitting. This magnetostrictive film 45 can be described as magnetoelastic FMR, and is highly promising due to the low insertion loss (~1 dB) and very high (~60 dB) isolation.

The surface acoustic waves 35 that transmit though the magnetostrictive film 45 are transduced back to RF electric fields (e.g., electric signal 37). The FMR frequency can be tuned by applying a DC voltage 80 to the adjacent electrodes 67a, 67b, which creates a strain in the piezoelectric substrate 15, and which transfers the strain to the magnetostrictive film 45 thereby creating a change in the FMR frequency. Furthermore, the zero-field FMR frequency can be locally tailored through inherent bias techniques, as described above. These techniques can be used to create a band-pass filter 10. Accordingly, the band-pass function is created by tailoring the magnetostrictive film 45 to absorb several frequencies in different areas without a single frequency.

The device 55 maybe manufactured through several sequential deposition and lithography steps. One example of a manufacturing process 150 is described in the flowchart of FIG. 15, where a piezoelectric substrate 15 is provided in block 152, and block 154 describes lithographically defining the electrodes 25, 30 by depositing the input and output electrodes 25, 30 and the DC tuning electrodes 67a, 67b on the piezoelectric substrate 15. The lithography process may include using/removing a photoresist using a lift-off process. Block 156 describes defining the magnetostrictive film 45 by depositing a low-loss magnetostrictive material (e.g., ferromagnetic material 50), depositing exchange bias or dipolar bias film(s), performing a lift-off of a photoresist, and locally (band-pass or other configuration) or uniformly (band-gap) magnetically annealing the film, which involves locally or uniformly heating pass the Curie (Neal) temperature and cooling in the presence of an external electric field. This locks in the desired patterned or uniform internal bias.

As such, the creation of the device 55 can be accomplished through a variety of different lithography steps and arrangements. This includes, using a thin film electrode (e.g., electrodes 25, 30, 67a, 67b) on a thicker slab of magnetic material, or using both thin films of piezoelectric and magnetic material on a non-active substrate such as silicon. There are many different materials that can be used for the magnetostrictive film 45 including low RF loss, high-magnetostrictive materials and high-loss, high magnetostrictive materials when the material has been made sufficiently thin to enhance resistance and thus decrease RF losses through mechanisms such as eddy currents. Other alternatives include patterning the DC electrodes 67a, 67b underneath and on top of the piezoelectric substrate 15 capped with the magnetostrictive film 45, instead of having the electrodes 67a, 67b adjacent to the magnetostrictive film 45.

The device 55 is used by applying RF electric-fields to the transmitting electrodes 25 and to transform the voltages into acoustic frequencies, then applying a DC voltage 80 to the electrodes 67a, 67b that are adjacent to the magnetostrictive film 45 to strain the film 45 through strain coupling with the underlying piezoelectric substrate 15. This voltage induced strain tunes the FMR frequency of the magnetostrictive film 45 and thus tunes the absorption of the film 45. Any surface acoustic waves 35 not filtered by the film 45 are transformed back to RF signals 37 though the receiving electrode 30. The embodiments herein meet the much-needed metrics of tunable filters for mobile devices, namely <20% tuning range, with <3 dB insertion loss, with <30V, at a low cost, and in a compact package (<1 mm³). The filter 10 and device 55 may be implemented in smart phones as well as other handheld communication devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A filter comprising:
a piezoelectric substrate;
a surface acoustic wave (SAW) device on the piezoelectric substrate and comprising interdigitated input and output transducer electrodes comprising unequal widths, wherein the input transducer electrodes are to convert an incoming radio frequency (RF) electrical signal into surface acoustic waves;
a SAW propagation path between the input and output transducer electrodes; and
a magnetostrictive film in the SAW propagation path to filter the surface acoustic waves that are at a ferromagnetic resonance frequency of the magnetostrictive film, wherein the output transducer electrodes are to convert the filtered acoustic waves into an outgoing electrical RF signal.

2. The filter of claim 1, wherein the SAW device is to operate in a wide-band pass configuration.

3. The filter of claim 2, wherein wide-band pass configuration results in a transmission of frequencies up to −60 dB.

4. The filter of claim 1, wherein the magnetostrictive film comprises a ferromagnetic material.

5. The filter of claim 1, wherein the interdigitated input and output transducer electrodes comprise unequal widths between adjacent electrode fingers.

6. The filter of claim 1, wherein the magnetostrictive film is to absorb energy from the surface acoustic waves.

7. The filter of claim 1, wherein the magnetostrictive film is to reflect energy from the surface acoustic waves.

8. A device comprising:
a piezoelectric substrate;
a first set of electrodes on the piezoelectric substrate, wherein the first set of electrodes comprise first electrode fingers that are unevenly spaced apart from one another and which are set to convert an electrical signal having a first electrical profile to a surface acoustic wave (SAW);
a second set of electrodes on the piezoelectric substrate, wherein the second set of electrodes comprise second electrode fingers that are unevenly spaced apart from one another and which are set to convert the SAW to an electrical signal having a second electrical profile less than the first electrical profile; and
a ferromagnetic material on the piezoelectric substrate and positioned between the first set of electrodes and the second set of electrodes to create a SAW propagation path and to filter a SAW frequency that matches a ferromagnetic resonance frequency of the ferromagnetic material.

9. The device of claim 8, wherein the first set of electrodes and the second set of electrodes comprise slanted electrodes.

10. The device of claim 8, wherein the first set of electrodes and the second set of electrodes comprise chirped electrodes.

11. The device of claim 8, wherein the ferromagnetic material comprises ferrite.

12. The device of claim 8, comprising a pair of frequency tuning electrodes adjacent to the ferromagnetic material.

13. The device of claim 8, comprising any of magnonic and phononic crystals on or in the piezoelectric substrate.

14. A method comprising:
receiving an input radio frequency (RF) electrical signal in an input transducer electrode comprising unevenly spaced electrode fingers having unequal widths;
converting the input RF electrical signal into surface acoustic waves;
filtering the surface acoustic waves by interacting the surface acoustic waves with a magnetostrictive film to filter the surface acoustic waves that are at a ferromagnetic resonance frequency of the magnetostrictive film;
converting the filtered surface acoustic waves into an output RF electrical signal in an output transducer electrode comprising unevenly spaced electrode fingers having unequal widths; and
transmitting the output RF electrical signal.

15. The method of claim 14, comprising tuning the ferromagnetic resonance frequency of the magnetostrictive film.

16. The method of claim 14, comprising applying a magnetic field to the magnetostrictive film.

17. The method of claim 14, comprising applying a DC voltage to electrodes adjacent to the magnetostrictive film.

18. The method of claim 14, comprising tuning an external magnetic field adjacent to the magnetostrictive film.

19. The method of claim 14, comprising:
providing a piezoelectric substrate adjacent to the magnetostrictive film to allow the surface acoustic waves to propagate from the input transducer electrode to the output transducer electrode; and
creating a strain in the piezoelectric substrate.

20. The method of claim 14, wherein a difference in a strength of the input RF electrical signal and the output RF electrical signal is less than −1 dB.

* * * * *